US012812862B2

(12) United States Patent
Kwak et al.

(10) Patent No.: US 12,812,862 B2
(45) Date of Patent: Nov. 24, 2026

(54) SEMICONDUCTOR DEVICE AND METHOD OF MANUFACTURING SEMICONDUCTOR DEVICE

(71) Applicant: SK hynix Inc., Gyeonggi-do (KR)

(72) Inventors: Rho Gyu Kwak, Gyeonggi-do (KR); Jung Shik Jang, Gyeonggi-do (KR); In Su Park, Gyeonggi-do (KR); Na Yeong Yang, Gyeonggi-do (KR); Seok Min Choi, Gyeonggi-do (KR); Won Geun Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 338 days.

(21) Appl. No.: 18/585,177

(22) Filed: Feb. 23, 2024

(65) Prior Publication Data

US 2025/0203863 A1 Jun. 19, 2025

(30) Foreign Application Priority Data

Dec. 13, 2023 (KR) ........................ 10-2023-0181024

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
None
See application file for complete search history.

(56) References Cited

U.S. PATENT DOCUMENTS

| | | | | |
|---|---|---|---|---|
| 11,417,673 | B2 | 8/2022 | Luo et al. | |
| 2016/0300765 | A1* | 10/2016 | Li | H10D 84/0149 |
| 2019/0319113 | A1* | 10/2019 | Yu | H10D 64/017 |
| 2022/0415907 | A1 | 12/2022 | Watanabe | |
| 2023/0108322 | A1* | 4/2023 | Lee | H10B 43/50 257/314 |

* cited by examiner

*Primary Examiner* — Nicholas J Tobergte
(74) *Attorney, Agent, or Firm* — IP & T GROUP LLP

(57) ABSTRACT

A semiconductor device may include a gate structure including insulating layers and conductive layers alternately stacked over a source structure, a channel structure extending through the gate structure, an insulating support extending through the gate structure, a first seed layer surrounding a sidewall of the insulating support, and a first barrier layer positioned between the gate structure and the first seed layer.

18 Claims, 18 Drawing Sheets

SEMICONDUCTOR DEVICE AND METHOD OF MANUFACTURING SEMICONDUCTOR DEVICE

CROSS-REFERENCE TO RELATED APPLICATION

This application claims priority under 35 U.S.C. § 119 to Korean Patent Application No. 10-2023-0181024 filed on Dec. 13, 2023, which is incorporated herein by reference in its entirety.

BACKGROUND

1. Technical Field

The present disclosure relates generally to an electronic device and a method of manufacturing the electronic device, and more particularly, to a semiconductor device and a method of manufacturing the semiconductor device.

2. Related Art

An integration degree of a semiconductor device is mainly determined by the area occupied by the unit memory cell. Recently, as improvements in the integration degree of a two-dimensional semiconductor device in which a memory cell is formed as a single layer on a substrate have reached a plateau with little or no significant further improvements, a three-dimensional semiconductor device in which memory cells are stacked in multiple layers over a substrate has been proposed. In addition, at the present time significant efforts are focusing in developing more stable three-dimensional structures with improved operational reliability and functionalities as well as improved manufacturing methods.

SUMMARY

According to an embodiment of the present disclosure, a semiconductor device may include a gate structure including insulating layers and conductive layers alternately stacked over a source structure, a channel structure extending through the gate structure, an insulating support extending through the gate structure, a first seed layer surrounding a sidewall of the insulating support, and a first barrier layer positioned between the gate structure and the first seed layer.

According to an embodiment of the present disclosure, a method of manufacturing a semiconductor device may include forming a stack by alternately stacking first material layers and second material layers, forming an opening in the stack, forming a seed layer in the opening, and forming an insulating support by oxidizing the seed layer.

According to an embodiment of the present disclosure, a method of manufacturing a semiconductor device may include forming a stack by alternately stacking first material layers and second material layers, forming an opening in the stack, forming a barrier layer in the opening, forming a seed layer in the barrier layer, and forming an insulating support in the seed layer.

These and other features and advantages of the present invention will become apparent from the following drawings and detailed description of specific embodiments of the present disclosure.

DETAILED DESCRIPTION

An embodiment of the present disclosure provides a semiconductor device and a method of manufacturing the semiconductor device having a stable structure and an improved characteristic.

According to the present technology, a semiconductor device having a stable structure and improved reliability may be provided.

Hereinafter, embodiments according to the technical spirit of the present disclosure are described with reference to the accompanying drawings.

Figure 1A:
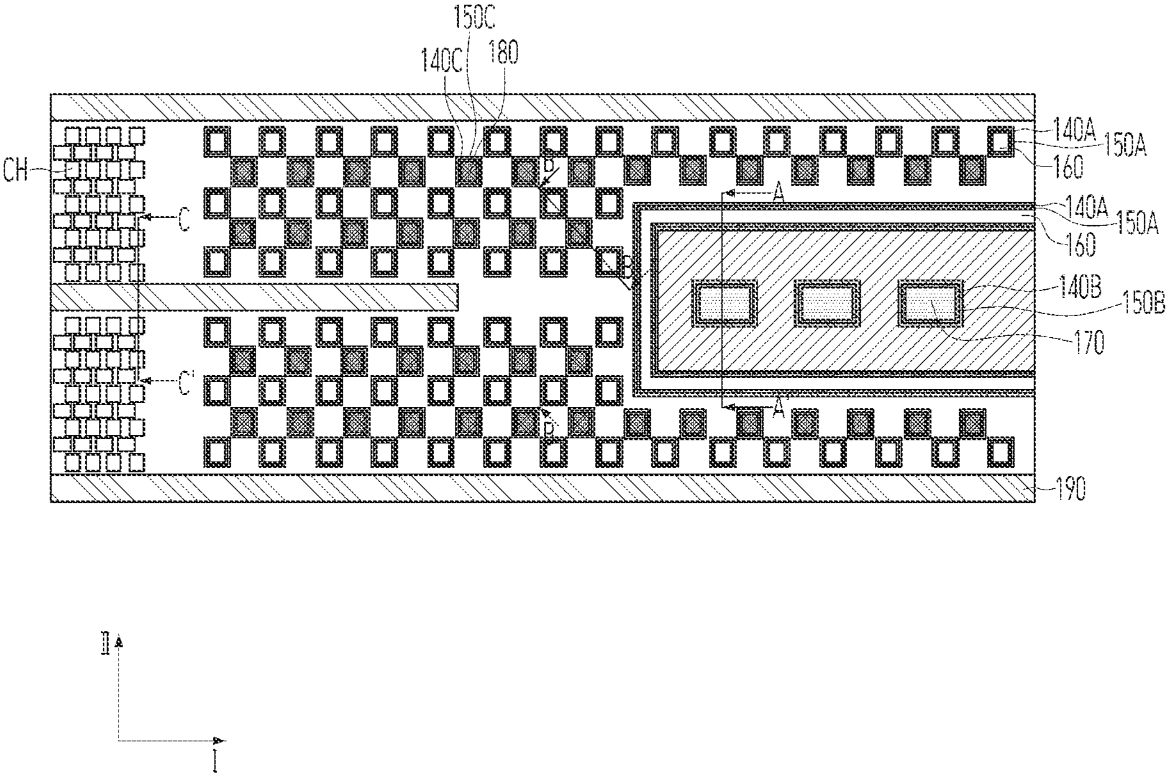
FIGS. 1A to 1D are diagrams illustrating a semiconductor device according to an embodiment of the present disclosure.
Figure 1B:
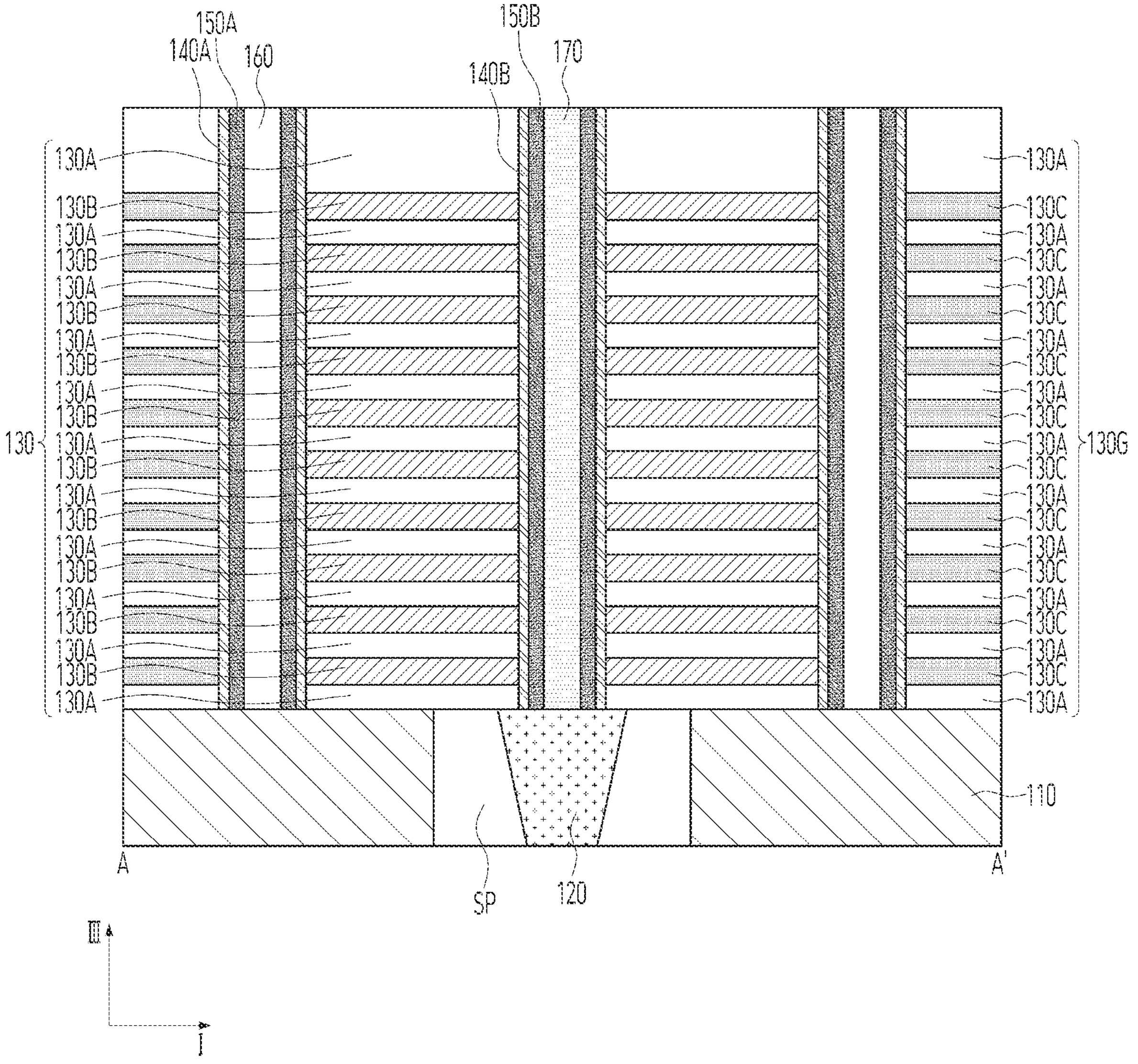
Figure 1C:
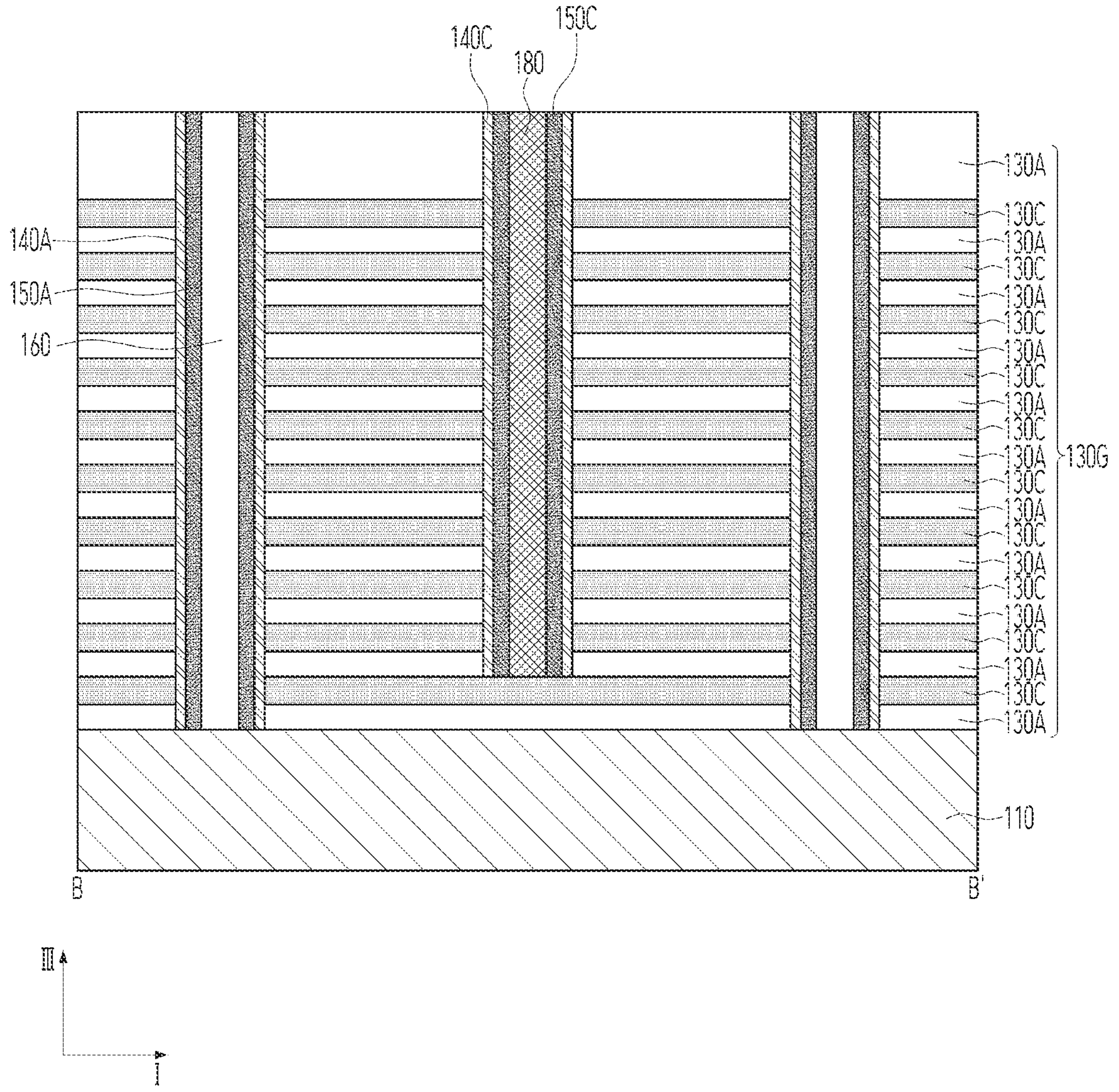
Figure 1D:
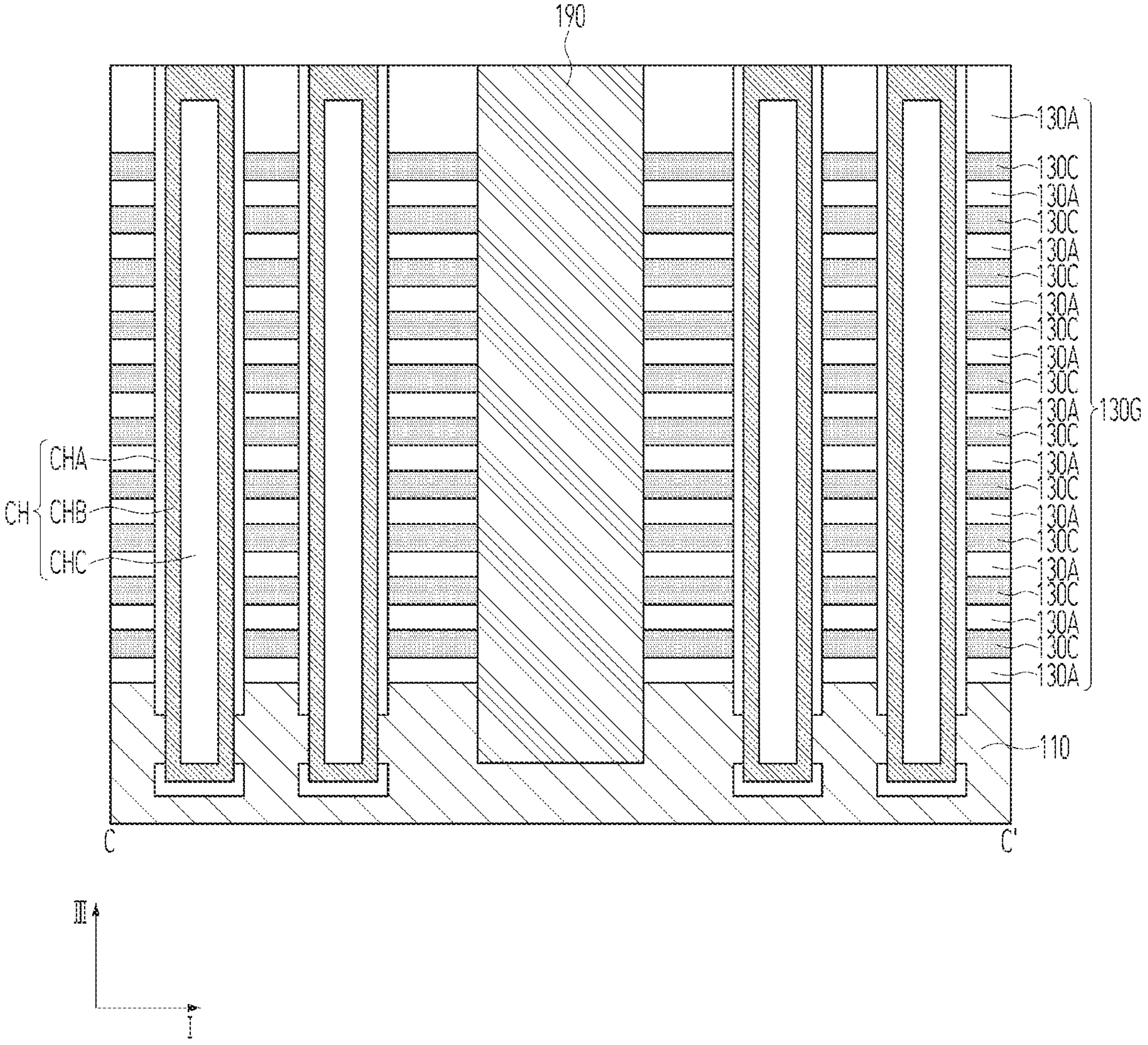

FIGS. 1A to 1D are diagrams illustrating a semiconductor device according to an embodiment of the present disclosure. FIG. 1A is a plan view, FIG. 1B is a cross-sectional view taken along A-A' of FIG. 1A, FIG. 1C is a cross-sectional view taken along B-B' of FIG. 1A, and FIG. 1D is a cross-sectional view taken along C-C' of FIG. 1A.

Referring to FIGS. 1A to 1D, the semiconductor device may include at least one of a source structure 110, a first contact plug 120, a stack 130, a gate structure 130G, a first barrier layer 140A, a second barrier layer 140B, a third barrier layer 140C, a first seed layer 150A, a second seed layer 150B, a third seed layer 150C, an insulating support 160, a second contact plug 170, a contact via 180, a slit structure 190, and a spacer SP.

The stack 130 may be positioned over or on, for example, on the source structure 110. The stack 130 may include insulating layers 130A and sacrificial layers 130B alternately stacked in a vertical or substantially vertical direction III (also referred to as the third direction) to a top surface of the source structure 110. In a manufacturing process of the semiconductor device, the sacrificial layers 130B may be replaced with conductive layers 130C, thus forming the gate structure 130G from the stack 130. The stack 130 may be replaced with the gate structure 130G. That is, the gate structure 130G may be positioned over or on, for example, on the source structure 110 and may include the insulating layers 130A and the conductive layers 130C alternately stacked. In some embodiments, the conductive layers 130C may be used as word lines, bit lines, or select lines. However, in other embodiments, the stack 130 may remain without being replaced with the gate structure 130G.

The insulating layers 130A may include an insulating material such as an oxide. The sacrificial layers 130B may include a sacrificial material such as a nitride or polysilicon. The conductive layers 130C may include a conductive material such as tungsten, molybdenum, or polysilicon. The source structure 110 may include a semiconductor material, for example, a polysilicon.

As illustrated in FIG. 1D, channel structures CH may pass through the gate structure 130G and extend partially into the source structure 110. Hence, the channel structures CH may be connected to the source structure 110. Each of the channel structures CH may include at least one of a channel layer CHA, a memory layer CHB surrounding the channel layer CHA, and an insulating core CHC in the channel layer CHA. In some embodiments, as for example, in the embodiment of FIG. 1D, the channel layer CHA of the channel structures CH may be connected to the source structure 110.

The insulating support 160 may extend through the gate structure 130G. Alternatively, the insulating support 160 may extend through the stack 130. Alternatively, the insulating support 160 may extend between the gate structure 130G and the stack 130. For example, in some embodiments, although not shown in the present drawings, the insulating support 160 may extend into the source structure 110 through the stack 130 or the gate structure 130G, and may extend into the source structure 110 by extending between the stack 130 and the gate structure 130G. The insulating support 160 may have a hole shape in a plane defined by a first direction I and a second direction II crossing the first direction I, and may have a line shape extending in the first direction I and/or the second direction II. For example, the insulating support 160 may have a quadrangular, circular, or oval cross-sectional shape. Also, as an example, the insulating support 160 may have a U shape extending in the first direction I and the second direction II. The insulating support 160 may minimize or prevent the stack 130 or the gate structure 130G from bending in the manufacturing process of the semiconductor device. The insulating support 160 may include an insulating material such as an oxide.

The first seed layer 150A may surround a sidewall of the insulating support 160. For example, the first seed layer 150A may extend between the stack 130, the gate structure 130G, or the stack 130 and the gate structure 130G, and may surround the sidewall of the insulating support 160. The first seed layer 150A may include a seed material for forming the insulating support 160. The seed material of the first seed layer 150A may include at least one of polysilicon and silicon carbon nitride (SiCN). The insulating support 160 may be an oxide of the first seed layer 150A.

The first barrier layer 140A may surround a sidewall of the first seed layer 150A. For example, the first barrier layer 140A may be positioned between the stack 130 and the first seed layer 150A, or may be positioned between the gate structure 130G and the first seed layer 150A. The first barrier layer 140A may prevent the first seed layer 150A from being connected to the stack 130 and the gate structure 130G. For example, when the first seed layer 150A includes a conductive material, the first barrier layer 140A may prevent the conductive material of the first seed layer 150A and the stack 130 or the conductive material of the gate structure 130G from being connected. In addition, the first barrier layer 140A may increase the support force of the insulating support 160 together with the first seed layer 150A. The first barrier layer 140A may include an insulating material such as an oxide.

The first contact plug 120 may be positioned in the source structure 110. The first contact plug 120 may have a tapered shape cross-section with the area of the cross-section being reduced gradually in a direction away from an upper portion to a lower portion. The upper portion may have a maximum value and may be positioned at the interface of the source structure 110 and the stack 130 or the gate structure 130G. The lower portion may have a minimum value and may be positioned at a bottom level of the source structure 110. However, the embodiments of the present disclosure are not limited thereto, and the first contact plug 120 may have a cross-section in which thickness of an upper portion and a lower portion are the same. The first contact plug 120 may be electrically connected to a peripheral circuit (not shown) positioned under the source structure 110. The spacer SP may surround a sidewall of the first contact plug 120. In some embodiments, the spacer SP may prevent the first contact plug 120 and the source structure 110 from being electrically connected. The spacer SP may include an insulating material such as an oxide, and the first contact plug 120 may include a conductive material such as tungsten.

The second contact plug 170 may extend through the stack 130. For example, the second contact plug 170 may extend through the stack 130 and may be connected to the first contact plug 120. The second contact plug 170 may be electrically connected to the first contact plug 120. Accordingly, the second contact plug 170, the first contact plug 120, and the peripheral circuit may be electrically connected. The second contact plug 170 may include a conductive material such as tungsten.

The second seed layer 150B may surround a sidewall of the second contact plug 170. The second seed layer 150B may prevent or minimize a connection between the second contact plug 170 and the stack 130 and/or the gate structure 130G due to tilting of the formed second contact plug 170 in a process of forming the second contact plug 170. The second seed layer 150B may include the same or substantially the same material as the first seed layer 150A. For example, the second seed layer 150B may include at least one of polysilicon and silicon carbon nitride (SiCN).

The second barrier layer 140B may surround a sidewall of the second seed layer 150B. For example, the second barrier layer 140B may be positioned between the stack 130 and the second seed layer 150B. The second barrier layer 140B may prevent the second seed layer 150B from being connected to the stack 130. The second barrier layer 140B may include an insulating material such as an oxide.

The contact via 180 may extend inside the gate structure 130G and may be connected to at least one of the conductive layers 130C. A plurality of contact vias 180 may be respectively connected to different conductive layers 130C of the gate structure 130G. In this case, the heights of the contact vias 180 may be different from each other, and the contact vias 180 may be connected to different conductive layers 130C at different levels of the gate structure 130G, respectively. The contact vias 180 may include a conductive material such as tungsten.

The third seed layer 150C may surround a sidewall of the contact via 180. The third seed layer 150C may prevent or minimize the contact via 180 from being tilted and formed in a process of forming the contact via 180. The third seed layer 150C may include the same or substantially the same material as the first seed layer 150A. For example, the third seed layer 150C may include at least one of polysilicon and silicon carbon nitride (SiCN).

The third barrier layer 140C may surround a sidewall of the third seed layer 150C. For example, the third barrier layer 140C may be positioned between the stack 130 and the third seed layer 150C. The third barrier layer 140C may prevent the third seed layer 150C from being connected to the gate structure 130G. The third barrier layer 140C may include an insulating material such as an oxide.

For example, in some embodiments, only the third barrier layer 140C may exist on a sidewall of the contact via 180. Alternatively, the third barrier layer 140C and/or the third seed layer 150C may not be positioned over or on, for example, on the sidewall of the contact via 180. For example, when each of the conductive layers 130C of the gate structure 130G has an exposed step structure, the third barrier layer 140C and/or the third seed layer 150C surrounding the sidewall of the contact via 180 may not be positioned.

The slit structure 190 may extend through the gate structure 130G. For example, the slit structure 190 may extend along the gate structure 130G in the second direction II. The channel structures CH may be positioned between adjacent slit structures 190. The insulating support 160, the second contact plugs 170, and the contact vias 180 may be positioned between adjacent slit structures 190. The slit structures 190 may include an insulating material such as an oxide. For example, in some embodiments, the slit structures 190 may include a semiconductor material and the like.

According to the structure as described above, the first seed layer 150A and the first barrier layer 140A may surround the sidewall of the insulating support 160. The first seed layer 150A and the first barrier layer 140A may increase the support force of the insulating support 160.

The second seed layer 150B and the second barrier layer 140B may surround a sidewall of the second contact plug 170. The third seed layer 150C and the third barrier layer 140C may surround the sidewall of the contact via 180. In this case, the seed layers 150B and 150C may prevent or minimize the second contact plug 170 and the contact via 180 from being tilted, and the barrier layers 140B and 140C may prevent or minimize the seed layers 150B and 150C from being connected to the stack 130 and/or the gate structure 130G.

Figure 2A:
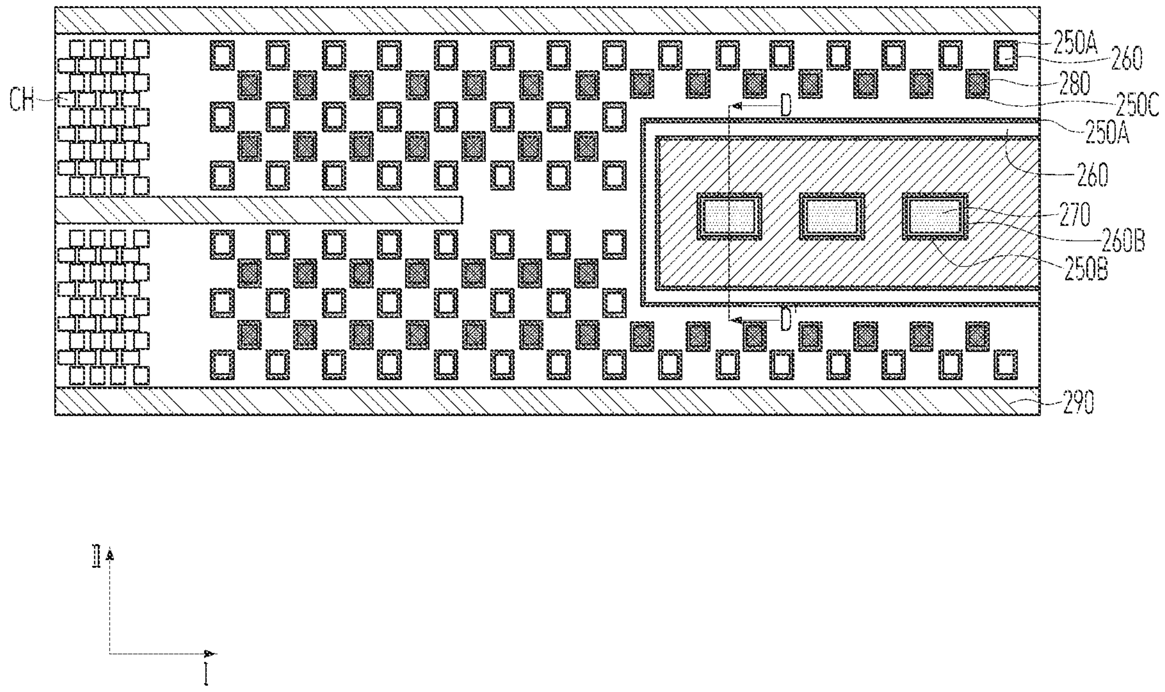
FIGS. 2A and 2B are diagrams illustrating a semiconductor device according to an embodiment of the present disclosure.
Figure 2B:
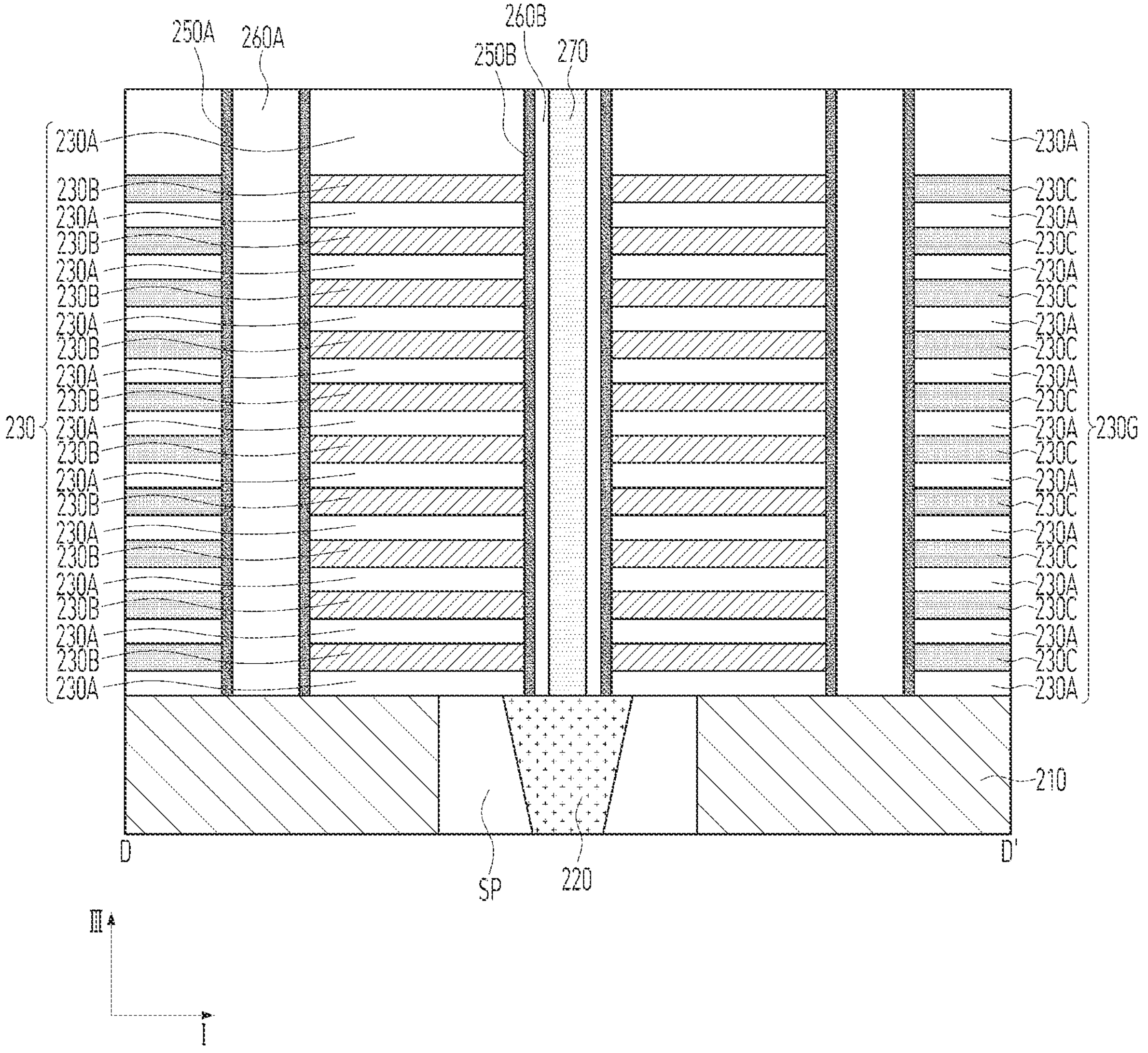

FIGS. 2A and 2B are diagrams illustrating a semiconductor device according to an embodiment of the present disclosure. FIG. 2A is a plan view, and FIG. 2B is a cross-sectional view taken along D-D' of FIG. 2A. Hereinafter, any content overlapping the content described above may be omitted.

Referring to FIGS. 2A and 2B, the semiconductor device may include at least one of a source structure 210, a first contact plug 220, a stack 230, a gate structure 230G, a first seed layer 250A, a second seed layer 250B, a third seed layer 250C, an insulating support 260A, a residual support 260B, a second contact plug 270, a contact via 280, a slit structure 290, and a spacer SP.

The stack 230 may be positioned over or on, for example, on the source structure 210. The stack 230 may include insulating layers 230A and sacrificial layers 230B alternately stacked. The stack 230 may be replaced with the gate structure 230G. The gate structure 230G may include insulating layers 230A and conductive layers 230C alternately stacked. In some embodiments, the conductive layers 230C may be used as a word line, a bit line, or a select line. The insulating layers 230A may include an insulating material such as an oxide. The sacrificial layers 230B may include a sacrificial material such as nitride or polysilicon. The conductive layers 230C may include a conductive material such as tungsten, molybdenum, or polysilicon. The source structure 210 may include a semiconductor material such as polysilicon.

The insulating support 260A may extend through the gate structure 230G. Alternatively, the insulating support 260A may extend through the stack 230. Alternatively, the insulating support 260A may extend between the gate structure 230G and the stack 230. The insulating support 260A may have a hole shape in the plane defined by the first direction I and the second direction II crossing the first direction I, and may have a line shape extending in the first direction I and/or the second direction II. The insulating support 260A may minimize or prevent the stack 230 or the gate structure 230G from bending in a manufacturing process of the semiconductor device. The insulating support 260A may include an insulating material such as an oxide.

The first seed layer 250A may surround a sidewall of the insulating support 260A. For example, the first seed layer 250A may extend into the stack 230 or the gate structure 230G, or extend between the stack 230 and the gate structure 230G, and may surround a sidewall of the insulating support 260A. The first seed layer 250A may include a seed material for forming the insulating support 260A. For example, the first seed layer 250A may include at least one of polysilicon and silicon carbon nitride (SiCN).

The second seed layer 250B may surround a sidewall of the second contact plug 270. The second seed layer 250B may prevent or minimize a connection between the second contact plug 270 and the stack 230 and/or the gate structure 230G due to tilting of the formed second contact plug 270 in a process of forming the second contact plug 270. The second seed layer 250B may include the same or substantially the same material as the first seed layer 250A. For example, the second seed layer 250B may include at least one of polysilicon and silicon carbon nitride (SiCN).

The residual support 260B may be positioned between the second seed layer 250B and the second contact plug 270. The residual support 260B may be left in a process of removing the insulating support 260A formed in the second seed layer 250B prior to forming the second contact plug 270. For example, in some embodiments, although not shown in the present drawing, the residual support 260B may be positioned between the third seed layer 250C and the contact via 280. Alternatively, the residual support 260B may not exist between the second seed layer 250B and the second contact plug 270. In this case, the second seed layer 250B may contact the second contact plug 270 and surround a sidewall of the second contact plug 270.

Referring again to FIGS. 1A and 1B, the first barrier layer 140A may not exist between the first seed layer 250A and the stack 230 or between the first seed layer 250A and the gate structure 230G. In addition, the second barrier layer 140B may not exist between the second seed layer 250B and the stack 230. In addition, the third barrier layer 140C may not exist between the third seed layer 250C and the gate structure 230G. In this case, the seed layers 250A, 250B, and 250C may contact the stack 230 or the gate structure 230G and extend along the stack 230 or the gate structure 230G. In some embodiments, the seed layers 250A, 250B, and 250C may include polysilicon or the like.

According to the structure described above, the residual support 260B may be positioned between the seed layers 250B and 250C and the second contact plug 270 or the contact via 280. In addition, a barrier layer may not exist between the seed layers 250A, 250B, and 250C and the stack 230 or the gate structure 230G.

Figure 3A:
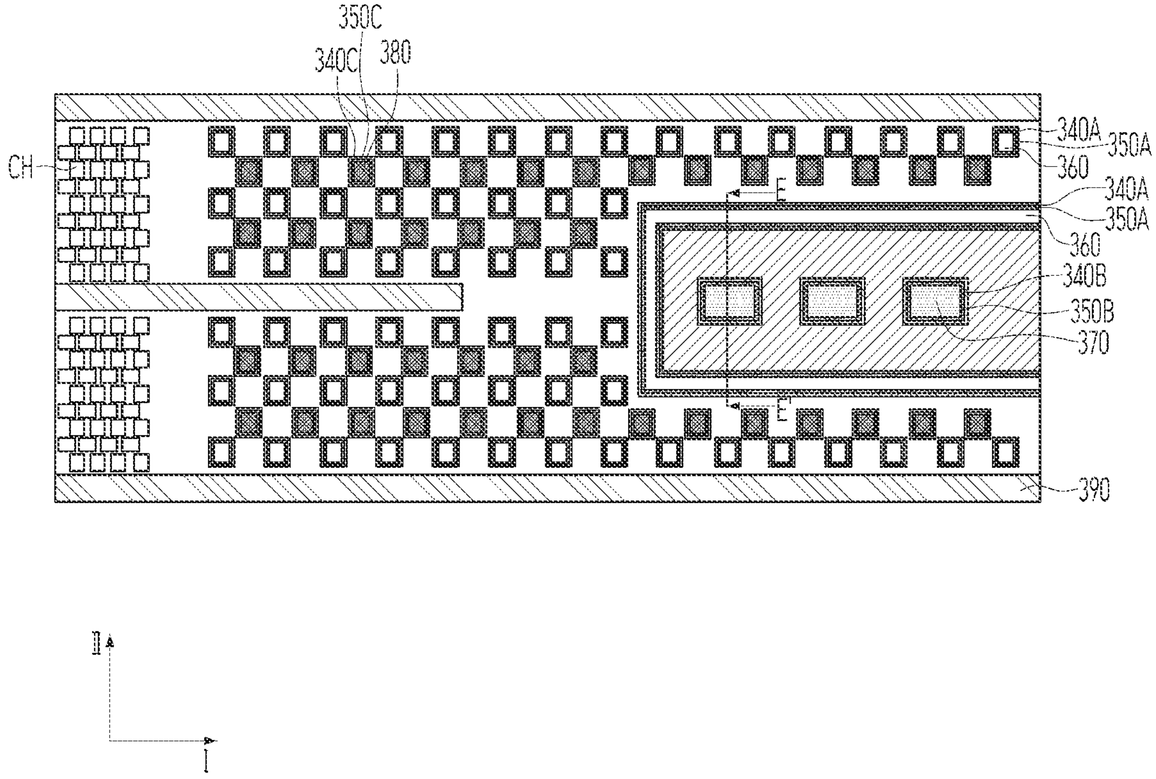
FIGS. 3A and 3B are diagrams illustrating a semiconductor device according to an embodiment of the present disclosure.
Figure 3B:
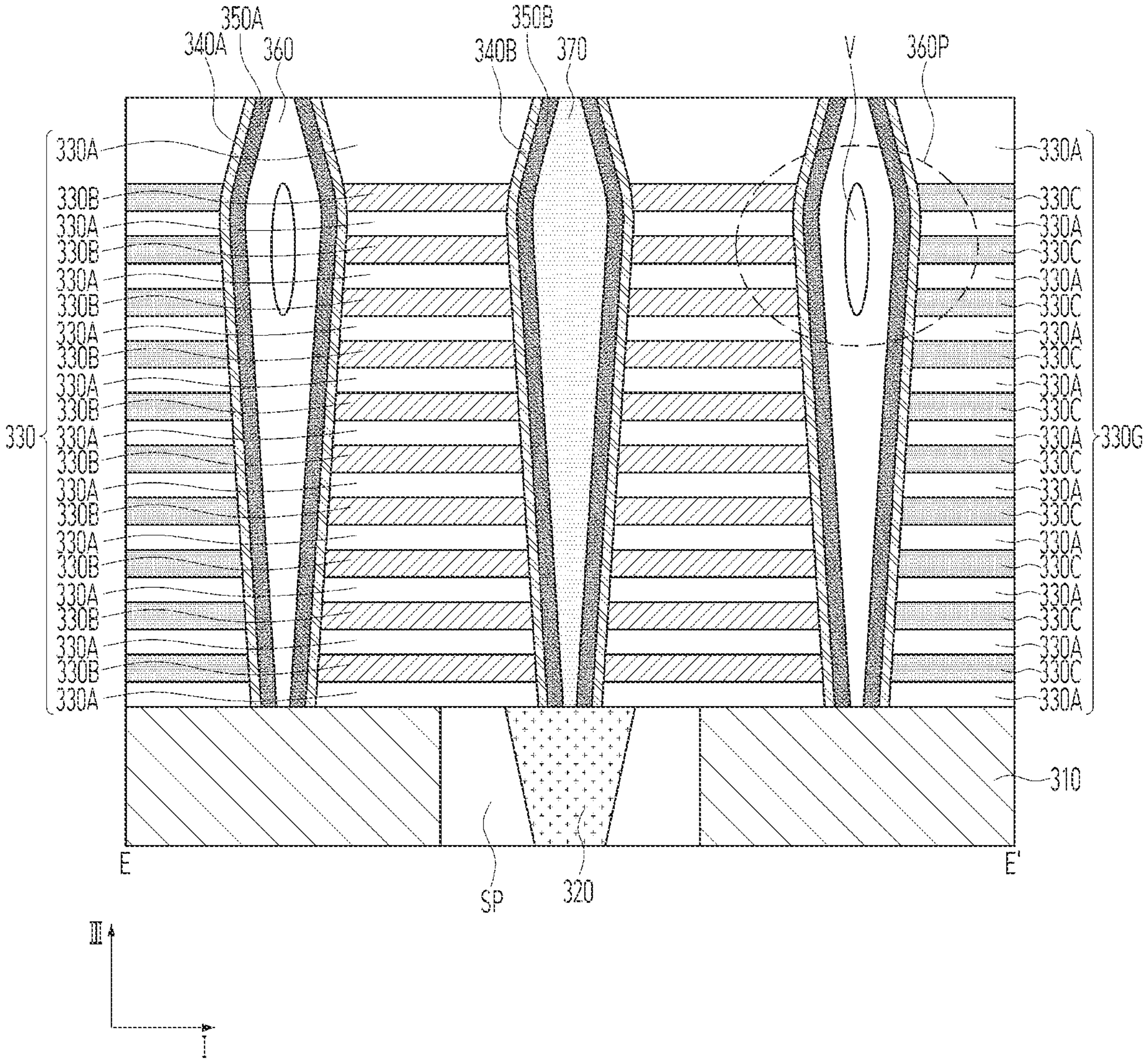

FIGS. 3A and 3B are diagrams illustrating a semiconductor device according to an embodiment of the present disclosure. FIG. 3A is a plan view, and FIG. 3B is a cross-sectional view taken along E-E' of FIG. 3A. Hereinafter, a content overlapping the content described above is omitted.

Referring to FIGS. 3A and 3B, the semiconductor device may include at least one of a source structure 310, a first contact plug 320, a stack 330, a gate structure 330G, a first barrier layer 340A, a second barrier layer 340B, a third barrier layer 340C, a first seed layer 350A, a second seed layer 350B, a third seed layer 350C, an insulating support 360, a second contact plug 370, a contact via 380, a slit structure 390, and a spacer SP.

The stack 330 and the gate structure 330G may be positioned over or on, for example, on the source structure 310. The stack 330 may include insulating layers 330A and sacrificial layers 330B alternately stacked. The gate structure 330G may include insulating layers 330A and conductive layers 330C alternately stacked.

The insulating support 360 may extend through the gate structure 330G. Alternatively, the insulating support 360A may extend through the stack 330. Alternatively, the insulating support 360A may extend between the gate structure 330G and the stack 330. The insulating support 360 may have a hole shape in the plane defined by the first direction I and the second direction II crossing the first direction I, and may have a line shape extending in the first direction I and/or the second direction II.

In addition, the insulating support 360 may have a bowing shape. For example, the insulating support 360 may have a bowing shape including a convex portion 360P. A width of the insulating support 360 may become narrower from the convex portion 360P toward a lower portion. Also, the width of the insulating support 360 may become narrower from the convex portion 360P toward an upper portion. A void V may be included in the insulating support 360. The void V may be formed in a process of forming the insulating support 360. For example, the void V may be formed at a position corresponding to the convex portion 360P of the insulating support 360. The insulating support 260A may include an insulating material such as an oxide. For example, in some embodiments, although not shown in the present drawing, channel structures CH and/or a contact via 380 may have a bowing shape.

The first barrier layer 340A and the first seed layer 350A may surround a sidewall of the insulating support 360. For example, the first barrier layer 340A and the first seed layer 350A may surround the sidewall of the insulating support 360 along the bowing shape. Therefore, the first barrier layer 340A and the first seed layer 350A may have a bowing shape. The first seed layer 350A may include at least one of polysilicon and silicon carbon nitride (SiCN). The first barrier layer 340A may include an insulating material such as an oxide.

The second contact plug 370 may extend through the stack 330 and may be connected to the first contact plug 320. The second contact plug 370 may have a bowing shape. For example, the second contact plug 370 may have a bowing shape in a position at a level corresponding to the convex portion 360P of the insulating support 360. The second contact plug 370 may not include a void V. The second contact plug 370 may include a conductive material such as tungsten.

The second barrier layer 340B and the second seed layer 350B may surround a sidewall of the second contact plug 370. Therefore, the second barrier layer 340B and the second seed layer 350B may also have a bowing shape. The second seed layer 350B may include the same or substantially the same material as the first seed layer 350A. The second barrier layer 340B may include an insulating material such as an oxide.

According to the structure described above, the insulating support 360, the second contact plug 370, the contact via 380, and the channel structures CH may have a bowing shape. In some embodiments, a void V may be included in the insulating support 360. In some embodiments, the void V may be formed at a position corresponding to the convex portion 360P of the insulating support 360.

Figure 4A:
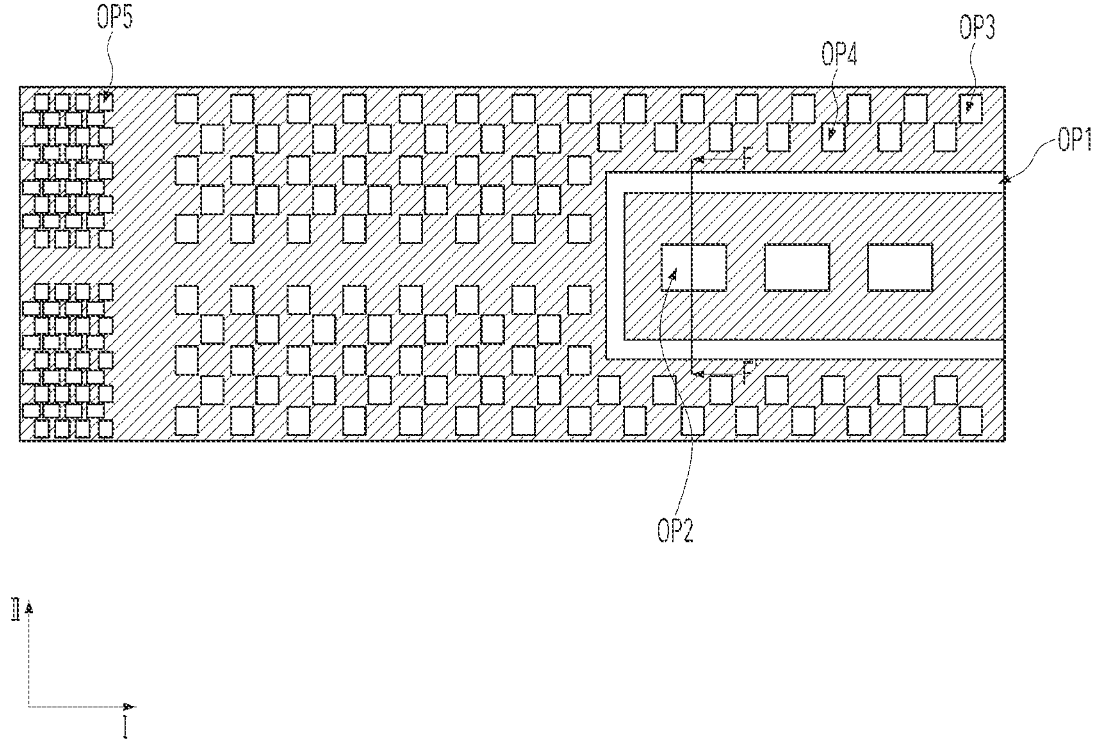
FIGS. 4A to 6B are diagrams illustrating a method of manufacturing a semiconductor device according to an embodiment of the present disclosure.
Figure 4B:
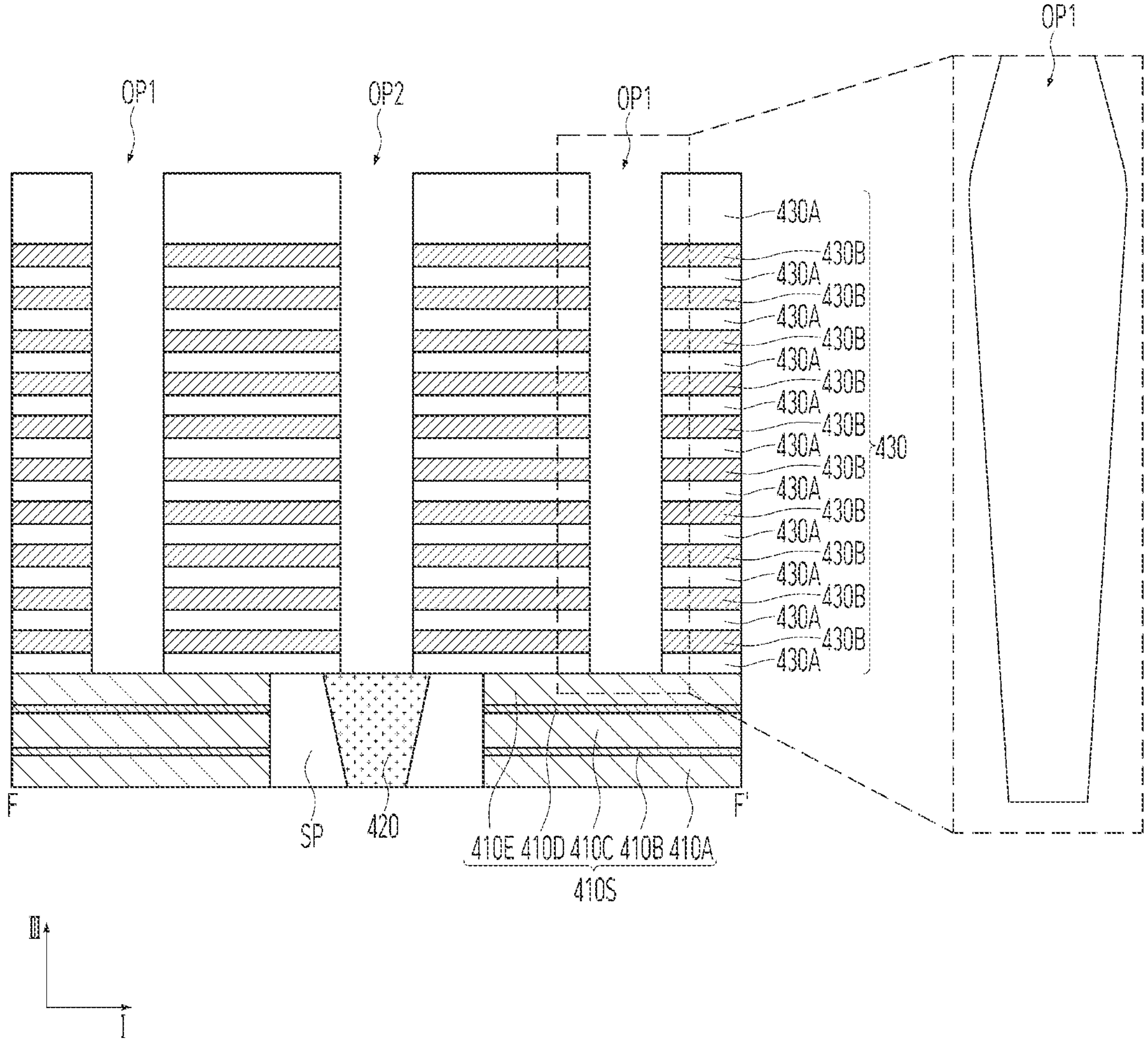
Figure 5A:
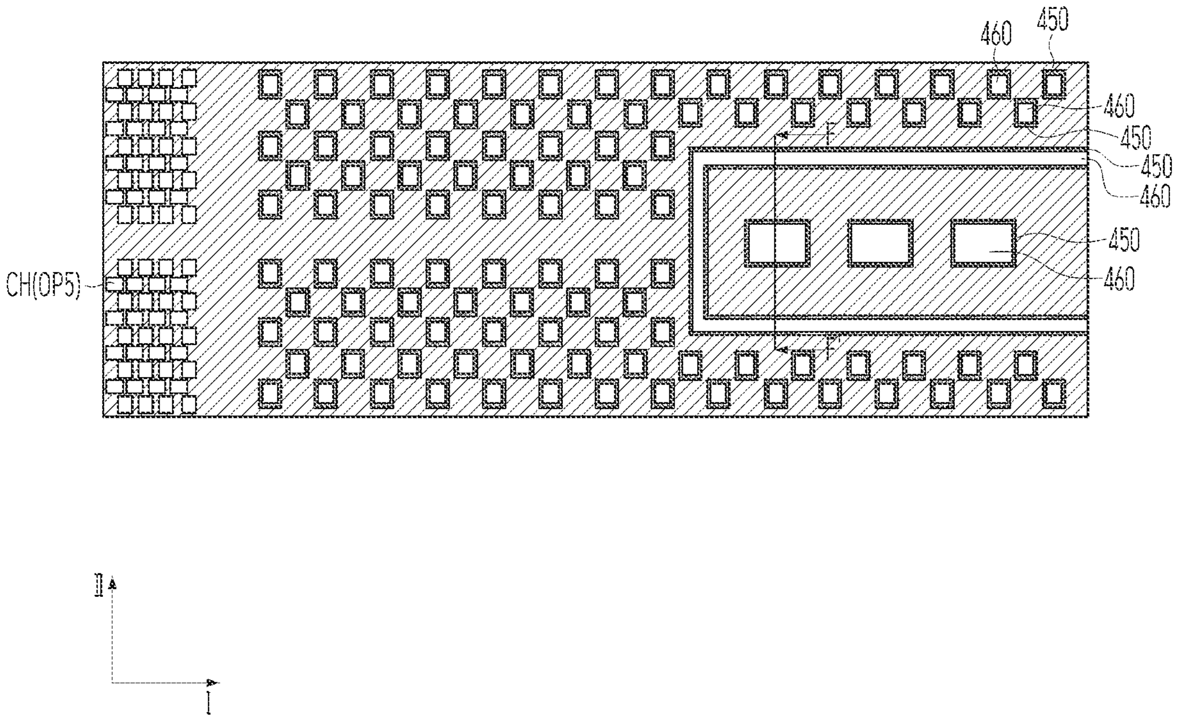
Figure 5B:
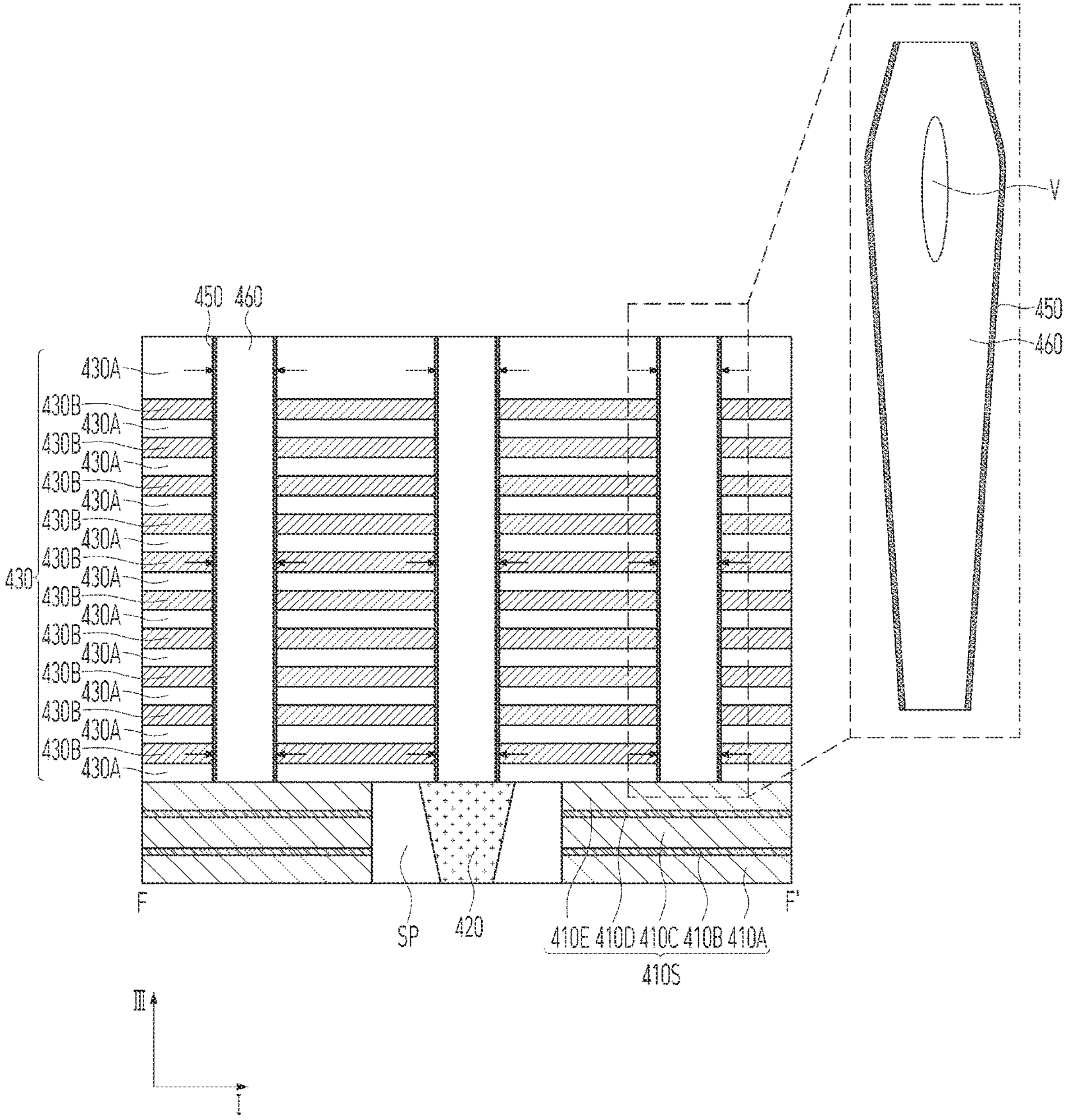
Figure 6A:
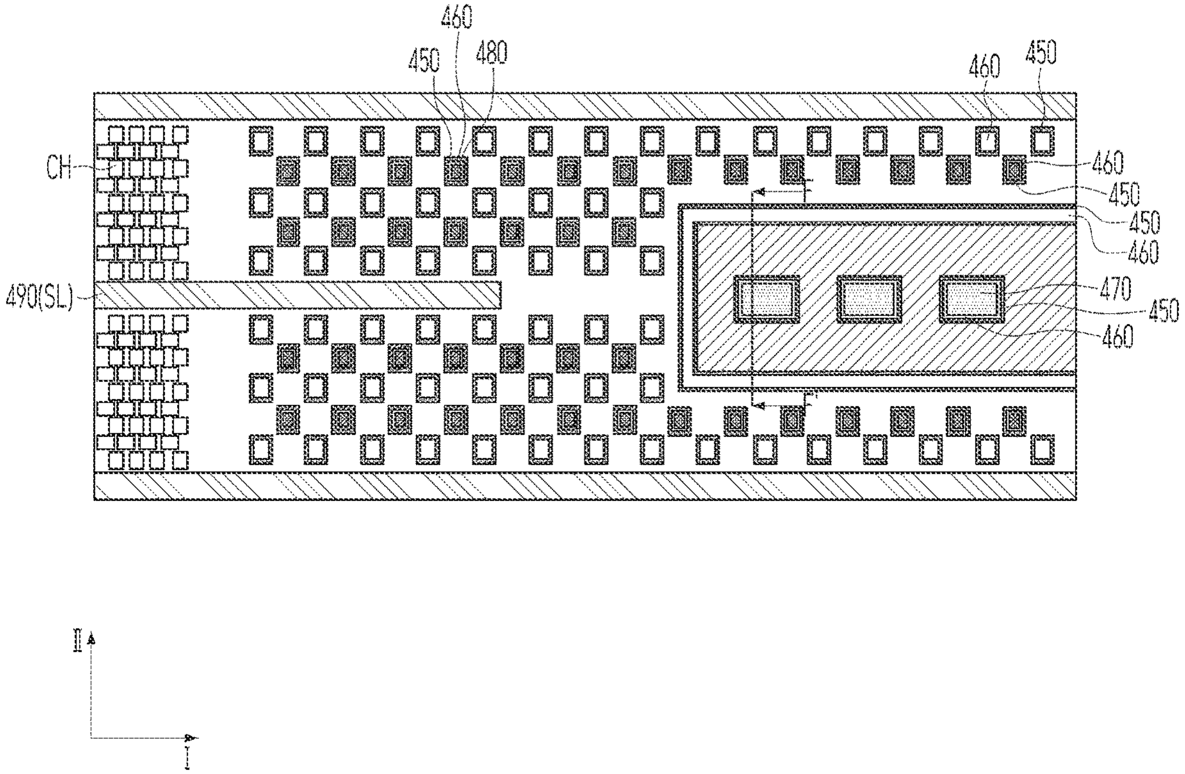
Figure 6B:
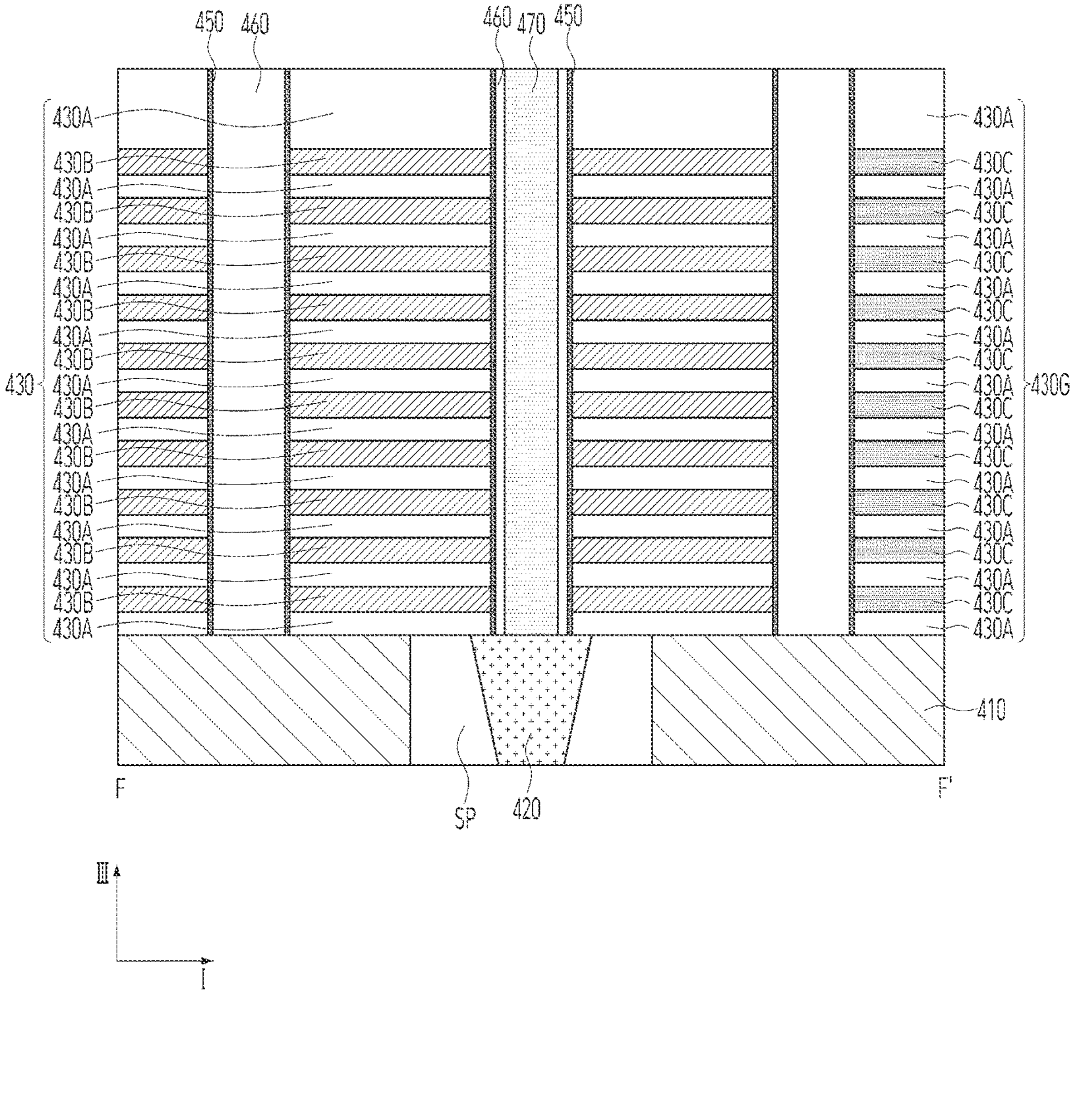

FIGS. 4A to 6B are diagrams illustrating a method of manufacturing a semiconductor device according to an embodiment of the present disclosure. FIGS. 4A, 5A, and 6A are plan views, and FIGS. 4B, 5B, and 6B are cross-sectional views taken along F-F' of respective FIGS. 4A, 5A, and 6A. Hereinafter, any content overlapping the content described above may be omitted.

Referring to FIGS. 4A and 4B, a preliminary source structure 410S may be formed. For example, the preliminary source structure 410S may be formed by sequentially stacking a first source layer 410A, a first protective layer 410B, a second source layer 410C, a second protective layer 410D, and a third source layer 410E. In some embodiments, the first source layer 410A, the second source layer 410C, or the third source layer 410E may include polysilicon or the like, and the first protective layer 410B or the second protective layer 410D may include an insulating material such as an oxide.

Subsequently, a first contact plug 420 may be formed in the preliminary source structure 410S. First, a preliminary spacer may be formed by forming a trench in the preliminary source structure 410S.

Subsequently, the first contact plug 420 extending through the preliminary spacer may be formed. The first contact plug 420 may be formed to have a tapered shape. In this process, the preliminary spacer may surround a sidewall of the first contact plug 420 as a spacer SP. In some embodiments, the first contact plug 420 may include a conductive material such as tungsten, and the spacer SP may include an insulating material such as an oxide.

Subsequently, a stack 430 may be formed on the preliminary source structure 410S. For example, the stack 430 may be formed by alternately stacking first material layers 430A and second material layers 430B. In some embodiments, the first material layers 430A may include an insulating material such as an oxide, and the second material layers 430B may include a sacrificial material such as nitride. Alternatively, the second material layers 430B may include a conductive material such as polysilicon.

Subsequently, openings OP1, OP2, OP3, OP4, and OP5 may be formed in the stack 430. For example, the openings OP1, OP3, and OP5 exposing the preliminary source structure 410S may be formed through the stack 430. Alternatively, the second opening OP2 exposing the first contact plug 420 through the stack 430 may be formed. Alternatively, the fourth opening OP4 exposing at least one of the second material layers 430B through the stack 430 may be formed.

The openings OP1, OP2, OP3, OP4, and OP5 may have various shapes and various sizes. The openings OP1, OP2, OP3, OP4, and OP5 may have a hole shape or may have a line shape. Alternatively, the openings OP1, OP2, OP3, OP4, and OP5 may have a bowing shape in which an upper portion is convex. Alternatively, the openings OP1, OP2, OP3, OP4, and OP5 may have a tapered shape. For example, the first opening OP1 of a line shape extending in the first direction I and/or the second direction II may be formed. In some embodiments, the first opening OP1 may have a U shape. Alternatively, hole shape of second opening OP2, third opening OP3, fourth opening OP4, and fifth opening OP5 may be formed. In some embodiments, shapes and sizes of the openings OP2, OP3, OP4, and OP5 may be substantially equal to each other or different from each other.

Referring to FIGS. 5A and 5B, channel structures CH may be formed. For example, the channel structure CH including a channel layer may be formed in the fifth opening OP5. The channel structure CH may further include at least one of a memory layer surrounding the channel layer and an insulating core in the channel layer.

A seed layer 450 may be formed in the openings OP1, OP2, OP3, and OP4. For example, the seed layer 450 may be formed conformally in the openings OP1, OP2, OP3, and OP4. In some embodiments, the seed layer 450 may be for forming an insulating support 460 in a subsequent process. Therefore, the seed layer 450 may include a material having a selectivity with the insulating support 460. For example, the seed layer 450 may include at least one of polysilicon and silicon carbon nitride (SiCN).

Subsequently, the insulating support 460 may be formed by oxidizing the seed layer 450. For example, the insulating support 460 may be formed by oxidizing the seed layer 450 to fill the openings OP1, OP2, OP3, and OP4. The insulating support 460 may be used as a sacrificial structure that is removed in a subsequent process, or may be used as a support that prevents or minimizes the stack 430 from bending in a subsequent process. In some embodiments, a portion of the seed layer 450 may remain. A thickness of the remaining seed layer 450 may be substantially equal to or different from a thickness of the insulating support 460. For example, the thickness of the remaining seed layer 450 may be relatively less than the thickness of the insulating support 460.

In a process of forming the insulating support 460, a void V may be formed in the insulating support 460. For example, in a process of oxidizing the seed layer 450, a convex portion of the openings OP1, OP2, OP3, and OP4 may be less oxidized, and thus the void V may be generated. However, according to an embodiment of the present disclosure, the seed layer 450 may be oxidized to form the insulating support 460, and thus a size of the void V may be relatively less than that of a case where the insulating support 460 is formed in a deposition method in the openings OP1, OP2, OP3, and OP4 without forming the seed layer 450. Therefore, according to an embodiment of the present disclosure, occurrence of a crack of the insulating support 460 may be prevented or minimized, and a bridge problem or the like occurring due to exposure of other structures through the void V in a process of proceeding with a subsequent process may be prevented or minimized.

For example, in some embodiments, after forming the insulating support 460, an additional support may be formed in the openings OP1, OP2, OP3, and OP4. For example, although not shown in the present drawing, even though the insulating support 460 is formed by completely oxidizing the seed layer 450, when an empty space exists in the openings OP1, OP2, OP3, OP4, the additional support may be deposited and formed. In some embodiments, the additional support may include an insulating material such as an oxide. Therefore, an interface may not exist in the insulating support 460 and the additional support, and the insulating support 460 and the additional support may be used as one support.

Referring to FIGS. 6A and 6B, a gate structure 430G including first material layers 430A and third material layers 430C alternately stacked may be formed. First, slits SL extending in the first direction I through the stack 430 may be formed. The slits SL may be formed spaced apart from each other in the second direction II crossing the first direction I. Subsequently, the second material layers 430B may be selectively removed through the slits SL and replaced with third material layers 430C. Accordingly, the stack 430 may be replaced with the gate structure 430G. In some embodiments, the insulating supports 460 may prevent or minimize the stack 430 from bending when removing the second material layers 430B. For example, a hole shape of insulating supports 460 may prevent or minimize the stack 430 from bending. The second material layers 430B may not be removed and may remain in a region where the insulating support 460 surrounding the stack 430 in a U shape is positioned. Therefore, a portion of the insulating supports 460 may be positioned between the stack 430 and the gate structure 430G. Subsequently, a slit structure 490 may be formed in the slit SL. In some embodiments, the slit structure 490 may include an insulating material such as an oxide or a semiconductor material.

For example, in some embodiments, although not shown in the present drawing, the slits SL may extend into the preliminary source structure 410S through the stack 430. Before forming the slit structure 490, an opening may be formed by removing the first protective layer 410B, the second source layer 410C, and the second protective layer 410D through the slit SL, and a portion of a memory layer may be removed so that the channel layer of the channel structures CH is exposed through the opening. Subsequently, a semiconductor material or the like may be formed in the opening.

Subsequently, a second contact plug 470 extending through the stack 430 may be formed. First, the second opening OP2 may be reopened by removing the insulating support 460. In some embodiments, only a portion of the insulating support 460 may be removed. Subsequently, the second contact plug 470 may be formed by forming a conductive material in the second opening OP2. In some embodiments, the conductive material may be tungsten or the like. The insulating support 460 may be a barrier layer together with the seed layer 450, and may prevent or minimize the stack 430 from being exposed in a process of reopening the second opening OP2. Therefore, the second contact plug 470 may be prevented from being tilted and formed.

Contact vias 480 extending through the gate structure 430G may be formed. For example, the fourth openings OP4 may be reopened by partially removing the insulating support 460. Subsequently, the contact vias 480 may be formed by forming a conductive material in the fourth openings OP4. In some embodiments, the conductive material may be a conductive material such as tungsten. For example, in some embodiments, before forming the contact vias 480, each of the third material layers 430C of the gate structure 430G may be exposed by extending each of the fourth openings OP4. This may be for electrically connecting contact vias 480 to the third material layers 430C, respectively.

According to the manufacturing method described above, the seed layer 450 may be formed in the openings OP1, OP2, OP3, and OP4. Subsequently, the insulating support 460 may be formed by oxidizing the seed layer 450. In this case, the size of the void V inside the insulating support 460 may be relatively small compared to a case where the insulating support 460 is formed in a deposition method.

In addition, the seed layer 450 and the insulating support 460 may be a support and/or a barrier layer, may prevent or minimize the stack 430 and/or the gate structure 430G from bending, and prevent or minimize the second contact plugs 470 and/or the contact vias 480 from being tilted and formed.

Figure 7A:
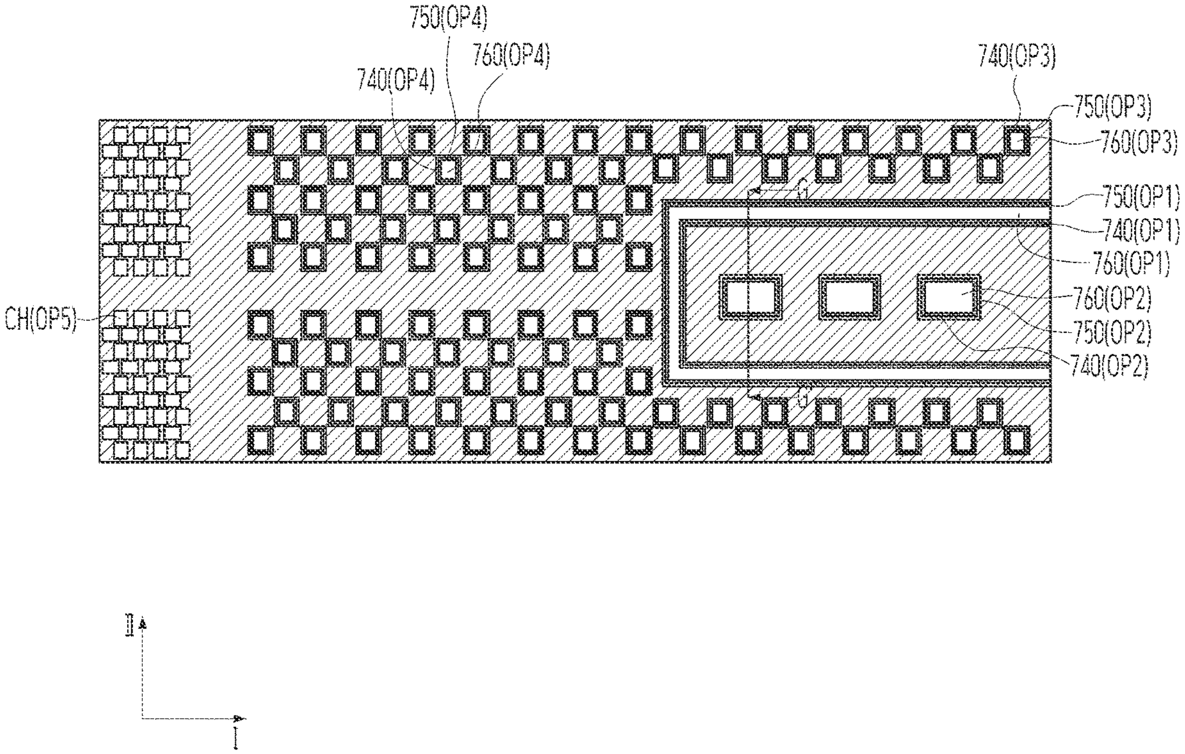
FIGS. 7A to 8B are diagrams illustrating a method of manufacturing a semiconductor device according to an embodiment of the present disclosure.
Figure 7B:
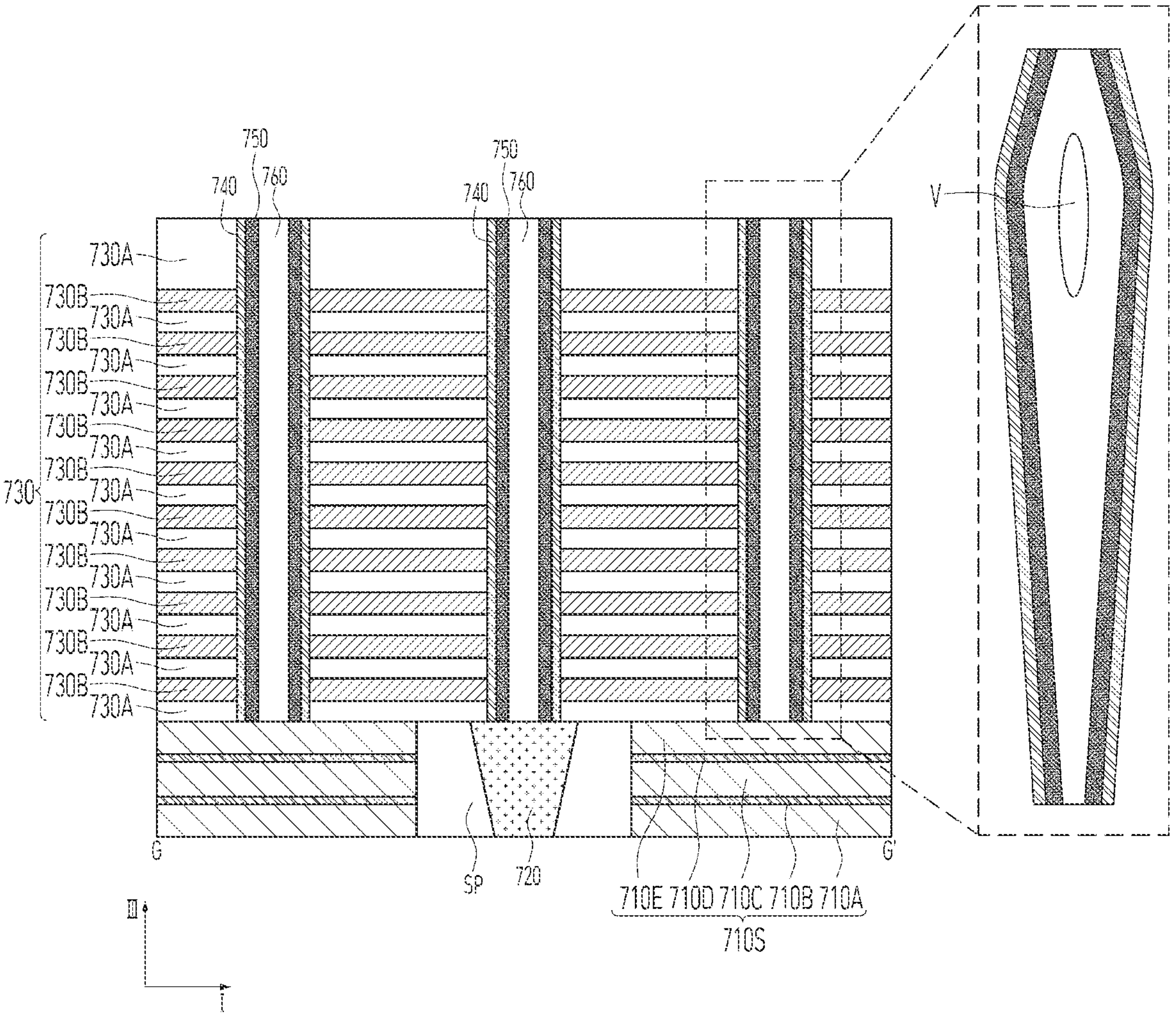
Figure 8A:
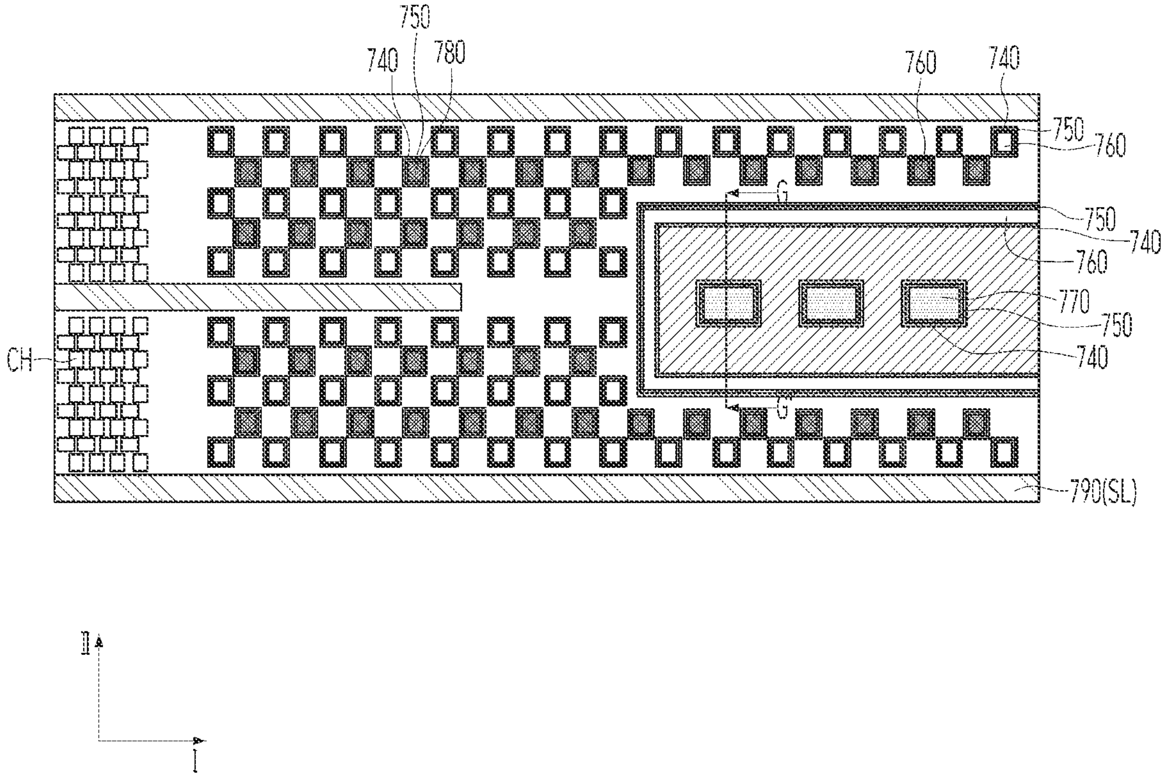
Figure 8B:
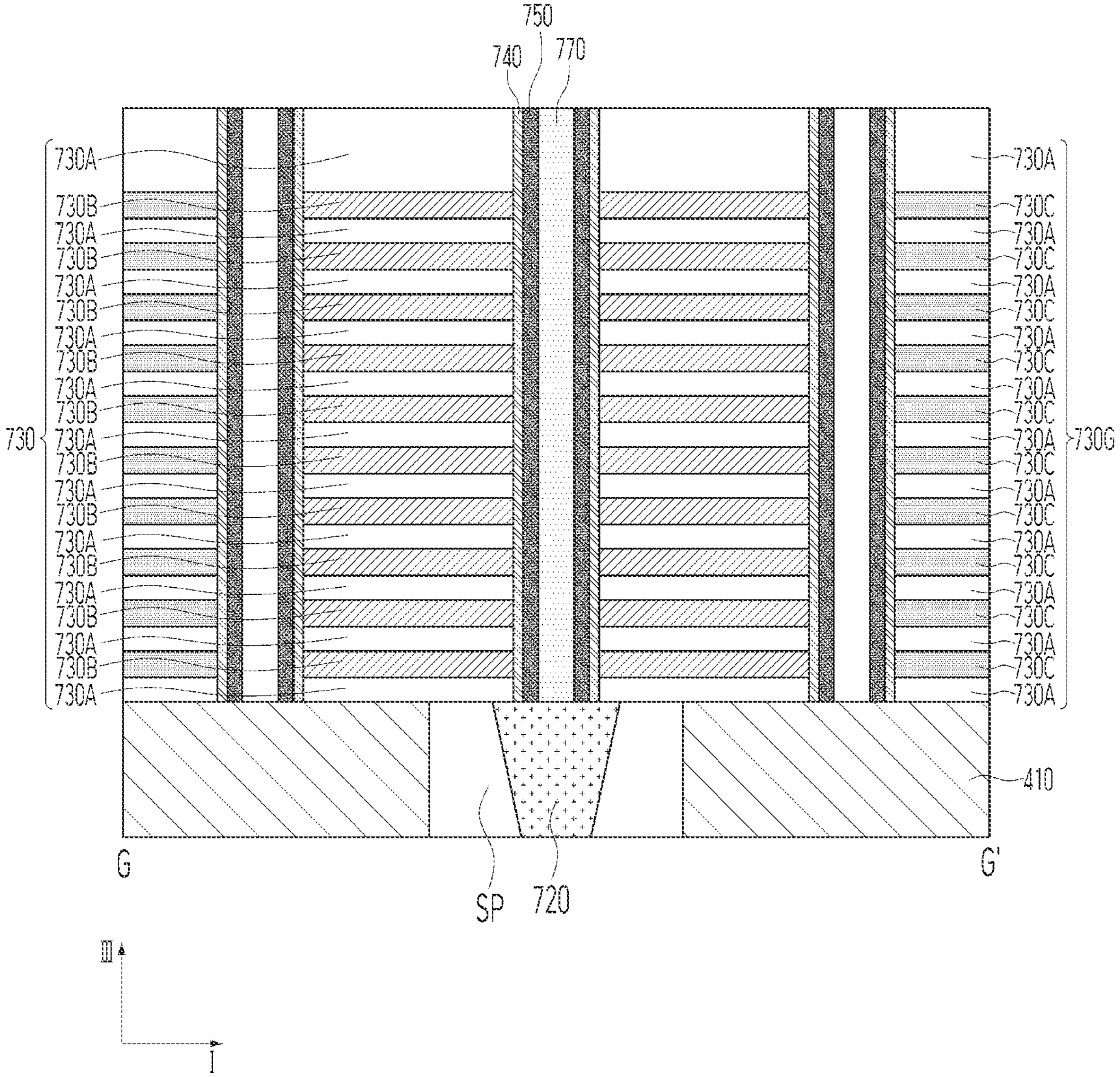

FIGS. 7A to 8B are diagrams illustrating a method of manufacturing a semiconductor device according to an embodiment of the present disclosure. FIGS. 7A and 8A are plan views, and FIGS. 7B and 8B are cross-sectional views taken along G-G' of respective FIGS. 7A and 8A. Hereinafter, content overlapping the content described above is omitted.

Referring to FIGS. 7A and 7B, a preliminary source structure 710S may be formed. For example, the preliminary source structure 710S may be formed by sequentially stacking a first source layer 710A, a first protective layer 710B, a second source layer 710C, a second protective layer 710D, and a third source layer 710E.

Subsequently, a first contact plug 720 may be formed in the preliminary source structure 710S. For example, a preliminary spacer may be formed by forming a trench in the preliminary source structure 710S, and the first contact plug 720 extending through the preliminary spacer may be formed.

Subsequently, a stack 730 may be formed by alternately stacking first material layers 730A and second material layers 730B on the preliminary source structure 710S. In some embodiments, the first material layers 730A may include an insulating material such as an oxide, and the second material layers 730B may include a sacrificial material such as nitride. Alternatively, the second material layers 730B may include a conductive material such as polysilicon.

Subsequently, openings OP1, OP2, OP3, OP4, and OP5 may be formed in the stack 730. The openings OP1, OP2, OP3, OP4, and OP5 may have various shapes and various sizes. The openings OP1, OP2, OP3, OP4, and OP5 may have a hole shape or may have a line shape. Alternatively, the openings OP1, OP2, OP3, OP4, and OP5 may have a bowing shape in which an upper portion has a convex portion. Alternatively, the openings OP1, OP2, OP3, OP4, and OP5 may have a tapered shape. For example, the first opening OP1 of a line shape extending in the first direction I and/or the second direction II may be formed. In some embodiments, the first opening OP1 may have a U shape. Alternatively, hole shapes of the second opening OP2, third opening OP3, fourth opening OP4, and fifth opening OP5 may be formed. In some embodiments, shapes and sizes of the openings OP2, OP3, OP4, and OP5 may be substantially equal to each other or different from each other.

A barrier layer 740 may be formed in the openings OP1, OP2, OP3, and OP4. Before forming a seed layer 750, the barrier layer 740 may be formed in the openings OP1, OP2, OP3, and OP4. In some embodiments, the barrier layer 740 may include an insulating material such as an oxide. Subsequently, the seed layer 750 may be formed in the barrier layer 740. The seed layer 750 may include at least one of polysilicon and silicon carbon nitride (SiCN).

Subsequently, an insulating support 760 may be formed in the seed layer 750. As an example, the insulating support 760 may be formed by oxidizing the seed layer 750. As another example, the insulating support 760 may be deposited and formed in the seed layer 750. However, the embodiments of the present disclosure are not limited thereto. After forming a portion of the insulating support 760 by oxidizing the seed layer 750, a remaining insulating support 760 may be formed in a deposition method. In this case, an interface between the insulating support 760, which is an oxide layer, and the insulating support 760, which is a deposition layer, may not exist.

In a process of forming the insulating support 760, a void V may be formed in the insulating support 760. However, according to an embodiment of the present disclosure, the insulating support 760 may be formed by oxidizing the seed layer 750, and in this case, the size of the void V may be relatively small. Alternatively, according to an embodiment of the present disclosure, the insulating support 760 may be formed by oxidizing the seed layer 750, and thus the size of the void V may be relatively small. Therefore, the embodiments of the present disclosure may prevent or minimize occurrence of a crack of the insulating support 760, and a bridge complication or the like occurring due to exposure of other structures through the void V in a process of proceeding with a subsequent process may be prevented or minimized.

Referring to FIGS. 8A and 8B, a gate structure 730G may be formed by replacing the second material layers 730B with third material layers 730C. First, slits SL extending in the first direction I may be formed through the stack 730. Subsequently, the second material layers 730B may be selectively removed through the slits SL and replaced with the third material layers 730C. Accordingly, the stack 730 may be replaced with the gate structure 730G. In some embodiments, the insulating supports 760 may prevent or minimize the stack 730 from bending when removing the second material layers 430B. The insulating support 760 may be a support configured of a triple layer together with the barrier layer 740 and the seed layer 750 and may have improved support force. Subsequently, slit structures 790 may be formed in the slits SL. In some embodiments, the slit structure 790 may include an insulating material such as an oxide, or may include a semiconductor material or the like.

Subsequently, a second contact plug 770 extending through the stack 730 may be formed. First, the second opening OP2 may be reopened by removing the insulating support 760. In some embodiments, the insulating support 760 may be selectively removed through a selectivity of the seed layer 750 and the insulating support 760. Subsequently, the second contact plug 770 may be formed by forming a conductive material in the second opening OP2. In some embodiments, the insulating support 760 may be completely removed. In this case, the seed layer 750 may be a barrier layer and may prevent the stack 730 from being exposed through the openings OP1, OP2, OP3, and OP4. Therefore, the second contact plug 770 may be prevented from being tilted and formed.

According to the manufacturing method described above, the barrier layer 740 may be formed in the openings OP1, OP2, OP3, and OP4. Subsequently, the seed layer 750 may be formed in the barrier layer 740. Subsequently, the insulating support 760 may be formed by oxidizing the seed layer 750. Alternatively, after forming a portion of the insulating support 760 by oxidizing the seed layer 750, a remaining insulating support 760 may be deposited and formed. In this case, the size of the void V inside the insulating support 760 may be relatively small.

In addition, the barrier layer 740, the seed layer 750, and the insulating support 760 may be one support configured of triple layers and may prevent or minimize the stack 730 and/or the gate structure 730G from bending.

Although embodiments according to the technical spirit of the present disclosure have been described with reference to the accompanying drawings, this is only for describing the embodiments according to the concept of the present disclosure, and the present disclosure is not limited to the above-described embodiments. Within the scope of the technical spirit of the present disclosure described in the claims, various forms of substitution, modification, and change of the embodiments will be possible by those skilled in the art to which the present disclosure belongs, and these also belong to the scope of the present disclosure. Furthermore, the embodiments may be combined to form additional embodiments.

What is claimed is:

1. A semiconductor device comprising:

a gate structure including insulating layers and conductive layers alternately stacked over a source structure;

a channel structure extending through the gate structure;

an insulating support extending through the gate structure;

a first seed layer surrounding a sidewall of the insulating support; and a first barrier layer positioned between the gate structure and the first seed layer.

2. The semiconductor device of claim 1, wherein the insulating support has a bowing shape.

3. The semiconductor device of claim 2, wherein a void is included in the insulating support at a level corresponding to a convex portion of the bowing shape of the insulating support.

4. The semiconductor device of claim 1, wherein the insulating support is an oxide of the first seed layer.

5. The semiconductor device of claim 1, wherein the first seed layer includes at least one of polysilicon and silicon carbon nitride (SiCN).

6. The semiconductor device of claim 1, wherein the first barrier layer includes an oxide.

7. The semiconductor device of claim 1, further comprising:

a stack including insulating layers and sacrificial layers alternately stacked;

the source structure positioned under the stack;

a first contact plug positioned in the source structure;

a second contact plug extending through the stack and connected to the first contact plug;

a second seed layer surrounding a sidewall of the second contact plug; and a second barrier layer surrounding a sidewall of the second seed layer.

8. The semiconductor device of claim 7, wherein the second seed layer includes at least one of polysilicon and silicon carbon nitride (SiCN).

9. The semiconductor device of claim 7, wherein the second barrier layer includes an oxide.

10. The semiconductor device of claim 7, further comprising:

a contact via extending through the gate structure and connected to at least one of the conductive layers;

a third seed layer surrounding a sidewall of the contact via; and a third barrier layer surrounding a sidewall of the third seed layer.

11. The semiconductor device of claim 10, wherein the third seed layer includes at least one of polysilicon and silicon carbon nitride (SiCN).

12. The semiconductor device of claim 10, wherein the third barrier layer includes an oxide.

13. A semiconductor device comprising:

a gate structure including insulating layers and conductive layers alternately stacked over a source structure;

a channel structure extending through the gate structure;

an insulating support extending through the gate structure, the insulating support having a bowing shape, and a void being included in the insulating support at a level corresponding to a convex portion of the bowing shape of the insulating support;

a first seed layer surrounding a sidewall of the insulating support; and a first barrier layer positioned between the gate structure and the first seed layer.

14. The semiconductor device of claim 13, wherein the insulating support is an oxide of the first seed layer.

15. The semiconductor device of claim 13, wherein the first seed layer includes at least one of polysilicon and silicon carbon nitride (SiCN).

16. The semiconductor device of claim 13, wherein the first barrier layer includes an oxide.

17. The semiconductor device of claim 13, further comprising:

a stack including insulating layers and sacrificial layers alternately stacked;

the source structure positioned under the stack;

a first contact plug positioned in the source structure;

a second contact plug extending through the stack and connected to the first contact plug;

a second seed layer surrounding a sidewall of the second contact plug; and a second barrier layer surrounding a sidewall of the second seed layer.

18. The semiconductor device of claim 17, further comprising:

a contact via extending through the gate structure and connected to at least one of the conductive layers;

a third seed layer surrounding a sidewall of the contact via; and a third barrier layer surrounding a sidewall of the third seed layer.

* * * * *